United States Patent [19]

Everard

[11] Patent Number: 4,743,858
[45] Date of Patent: May 10, 1988

[54] R. F. POWER AMPLIFIER

[75] Inventor: Jeremy K. A. Everard, Horley, England

[73] Assignee: U.S. Philips Corp., New York, N.Y.

[21] Appl. No.: 876,543

[22] Filed: Jun. 20, 1986

[30] Foreign Application Priority Data

Jun. 26, 1985 [GB] United Kingdom ............ 8516109

[51] Int. Cl.$^4$ .................... H03F 3/38; H03F 3/217
[52] U.S. Cl. ................................ 330/10; 330/251; 330/207 A
[58] Field of Search .............. 330/10, 207 A, 251

[56] References Cited

U.S. PATENT DOCUMENTS 3,919,656 11/1975 Sokal et al. .............. 330/251 X

OTHER PUBLICATIONS

Sokal, Nathan O., "Class E Can Boost Efficiency", Elec. Design, vol. 20, 9-27-77, pp. 96-102.
Sokal, Nathan O. and Alan D., "Class E-A New Class of Hi-Efficiency Tuned Switching Power Amps", IEEE J., S.S. Circuits, vol. SC-10, No, 3, June 1974, pp. 168-176.

Primary Examiner—Eugene R. Laroche
Assistant Examiner—Steven J. Mottola
Attorney, Agent, or Firm—Thomas A. Briody; William J. Streeter; Marianne R. Rich

[57] ABSTRACT

An r.f. power amplifier, typically a high efficiency, class E amplifier in which a reactive load circuit (18) is connected to a semiconductor switching device (10), the load circuit being designed to have the required input load angle and loaded Q so that the voltage across the device (10) goes to zero with zero slope before it switches on and passes current, is provided with a step recovery diode (32) connected to the device (10) to limit the voltage swing across the device (10) with no significant loss of efficiency. This allows the voltage-handling capability required of the device to be reduced or the amplifier output power to be increased by increasing the supply voltage.

5 Claims, 2 Drawing Sheets

R. F. POWER AMPLIFIER

BACKGROUND OF THE INVENTION

The present invention relates to an r.f. power amplifier comprising a switching device and a load network capable of adjusting the relative phase of the voltages across and currents through the switching device.

One known amplifier of this type is the so-called "Class E" amplifier described, for example, in U.S. Pat. No. 3,919,656. This amplifier comprises a switching device, such as a transistor with a parasitic capacitance, and a reactive load circuit which adjusts the phase of the voltages and currents to obtain high efficiency. Due to the Q of the load circuit, the peak voltage swing across the switching device is often much larger than the power supply voltage. This means that the switching device has to have a large breakdown voltage as well as other parameters required for high efficiency such as a low on-resistance. These parameters give rise to conflicting design rules when designing the switching device.

An object of the present invention is to enable these design rules to be relaxed.

SUMMARY OF THE INVENTION

According to one aspect the present invention provides an r.f. power amplifier comprising a switching device and a load network capable of adjusting the relative phase of the voltages across and currents through the switching device, characterised in that the amplifier comprises means for limiting the peak voltage swing across the switching device by storing charge during substantially the time period that the voltage is being limited and subsequently releasing the stored charge.

According to another aspect the present invention provides an r.f. power amplifier comprising a switching device having a pair of main electrodes, and a load network capable of adjusting the relative phase of the voltages across and the currents flowing between said main electrodes, characterised in that the amplifier includes means for limiting the peak voltage swing across said main electrodes by storing charge in response to charging of capacitance in parallel with said main electrodes attempting to drive the voltage across said main electrodes to above a predetermined value and releasing the stored charge in response to discharging of said capacitance subsequently attempting to reduce said voltage once again.

Said means for limiting the peak voltage swing may comprise a step recovery diode (sometimes known as a snap diode).

By limiting the peak voltage swing across the switching device in, for example, a Class E amplifier, using a charge storage/charge release means, the peak voltage swing across the switching device is reduced while still maintaining a high efficiency because the charge stored by said means is returned to the amplifier circuit. Moreover by being able to limit the voltage swing it is possible to obtain an increased amplifier output power for the same on-resistance and breakdown voltage by increasing the power supply voltage or conversely by suitable device processing the on-resistance and breakdown voltage can be reduced which together with a reduced load resistance and modified load network leads to the amplifier having an increased power output for the same efficiency at the original supply voltage.

DESCRIPTION OF THE DRAWINGS

The present invention will now be explained and described, by way of example, with reference to the accompanying drawings, wherein.

In the drawings the same reference numerals have been used to indicate the corresponding features.

DETAILED DESCRIPTION OF THE INVENTION

Figure 1:
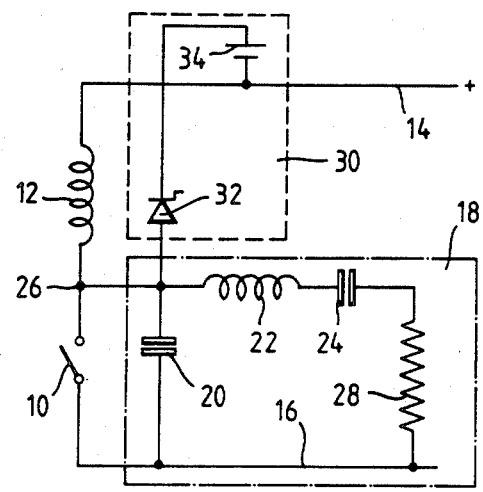
FIG. 1 is a circuit diagram of an r.f. power amplifier made in accordance with the present invention.
Figure 2:
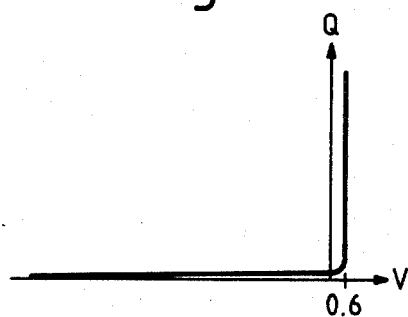
FIG. 2 is an idealised charge (Q)/voltage (V) characteristic of a step recovery diode.

Referring to FIG. 1, the r.f. power amplifier comprises a switching device 10, formed by a transistor with a parasitic capacitance and a shunt capacitor to obtain the required capacitance 20 for high efficiency (this assumes that the device's parasitic capacitance in parallel with its main electrodes, e.g. its collector and emitter electrodes or source and drain electrodes, is less than the total capacitance required), which is connected in series with a first inductance 12 between supply voltage lines 14, 16. A load network 18 is connected to the device 10. The network 18 comprises the shunt capacitance 20 which includes the parasitic capacitance in parallel with the main electrodes of the device 10, a second inductance 22 and a second capacitance 24 connected in series between the junction 26 of the device 10 and the first inductance 12, and a resistive load represented by a load resistor 28. A means 30 for limiting voltage swing across the device 10 comprises a step recovery diode or snap diode 32 whose anode is connected to the junction 26 and whose cathode is connected by way of a bias voltage supply 34 to the positive supply voltage line 14. The step recovery diode 32 has a PIN structure in which the intrinsic (I) region can store charge before conventional forward conduction occurs. This charge can also be extracted before conventional conduction occurs and once the charge has been extracted, the diode 32 becomes reverse biased and high impedance. This is illustrated in the idealised Q/V curve shown in FIG. 2 in which at a voltage of +0.6 volts charge is stored but when the charge is extracted the diode 10 becomes reverse biased.

Figure 3:
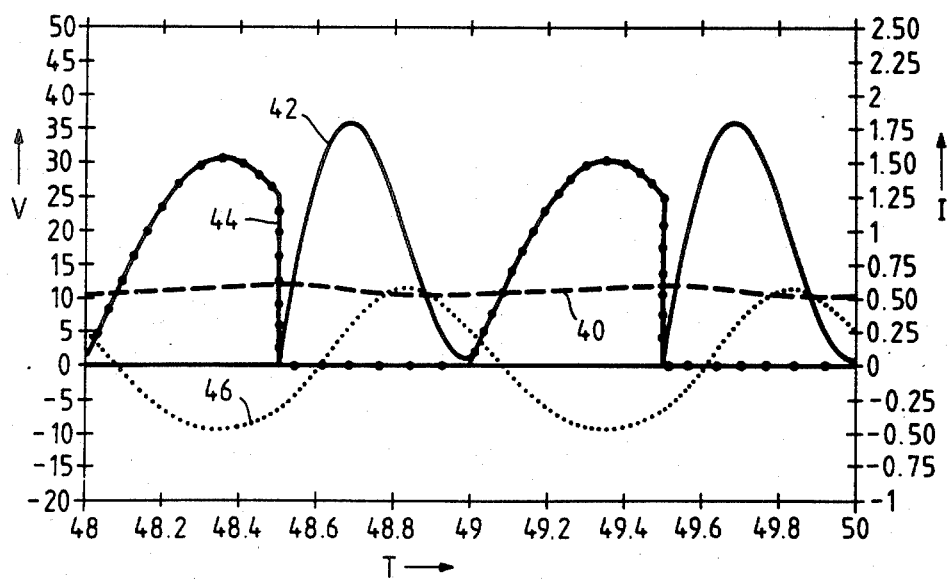
FIG. 3 shows performance curves relating to a class E amplifier not having means for limiting the voltage swing across the switching device.

Ignoring the means 30, the operation of the class E amplifier without voltage limiting will be described with reference to FIG. 3. In FIG. 3 the left hand ordinate is voltage, V, in volts, the right hand ordinate is current, I, in amps, and the abscissa represents time, T, in microseconds. The supply voltage is normalized to 10 volts and the supply current, curve 40, is of the order of 0.5 amps. For high efficiency, the firt inductance 12 has a large value so that it presents a high impedance at the operating frequency, i.e. the frequency of a control signal applied to the control electrode, e.g. base or gate, of the switching transistor. Also the load network 18 is designed to have the required input load angle and loaded Q to ensure that the voltage, curve 42, across the device 10 goes to zero, ideally with zero slope, just before the device 10 switches on to pass current, curve 44. The voltage is the integral of the current through the shunt capacitance 20. High efficiency is obtained by ensuring that power is not dissipated in the device 10, that is the voltage and current product always remains close to zero. In FIG. 3, curve 46 represents the voltage across the load resistance 28, which voltage is approximately sinusoidal as a result of the Q of the filter formed by the reactive load network 18.

If one examines the curve 42, it will be noted that the peak voltage swing is 35V or 3.5 times the supply voltage. This means that in designing the device 10 allowance has to be made for a high voltage swing as well as a low on-resistance, which is difficult to achieve.

Figure 4:
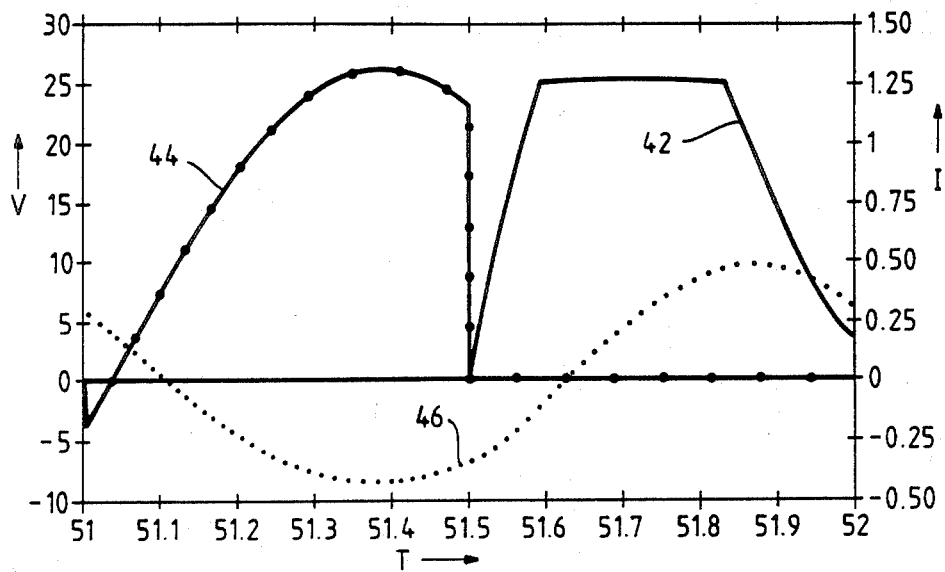
FIGS. 4 and 5 show performance curves relating to a class E amplifier made in accordance with the present invention.

Limiting the voltage swing by the means 30 mitigates this problem. An examination of FIG. 4 shows that the step recovery diode 32 (FIG. 1) limits the voltage, curve 42, at approximately 25V, the value of the bias voltage supply 34 being 25V, whilst enabling the amplifier to operate efficiently and to produce a substantially sinusoidal voltage across the load resistance 28.

Figure 5:
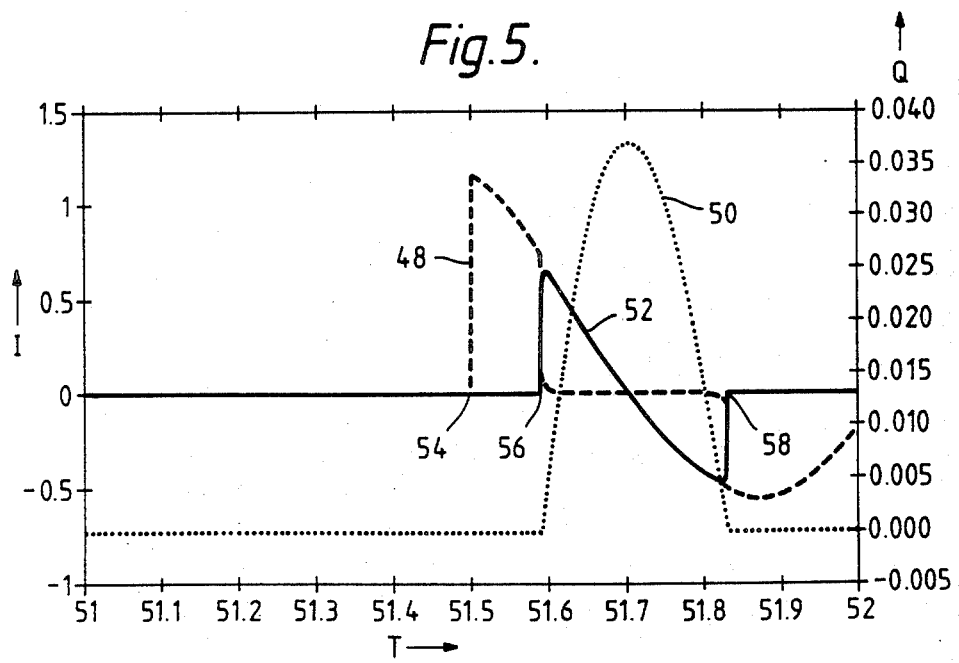

In FIG. 5 the left hand ordinate is current, I, the right hand ordinate is charge, Q, and the abscissa is time, T, in microseconds. The time scales in FIGS. 4 and 5 have been aligned to facilitate an understanding of the role of the step recovery diode 32 during the voltage limiting operation. In FIG. 5 the broken line curve 48 represents the current in the shunt capacitor 20, the dotted line curve 50 represents the charge condition of the diode 32 and the curve 52 represents the current in the diode 32.

At the instant 54 when the device 10 becomes non-conductive, the current through the shunt capacitance 20 increases substantially instantaneously because of continuity of current through the inductances 12 and 22 and then begins to decay due to current flow in the load network. At the instant 56, the voltage across the device 10 reaches a value such that the step recovery diode 32 becomes conductive, acts as a large capacitance and stores charge, thereby limiting the voltage swing across the device 10. Ideally, though, diode 32 does not go into conventional forward conduction at this time (or at all). At the commencement of the limiting period, point 56, the value of the current in diode 32 goes up to the value of the current in the shunt capacitor 20 because current flow is maintained by the first and second inductances 12, 22. This causes the intrinsic region of the diode 32 to charge up. As the current flowing through the diode 32 goes through zero and swings negative, thereby attempting to discharge the capacitance 20, the charge stored in the diode 32 decays, see curve 50. At the point 58, the diode 32 is reversed biased due to the voltage across the device 10 decreasing below the limiting value. Consequently the current through the diode ceases rapidly and the current through the shunt capacitance 20 goes up to the current in the diode 32 at this instant, again due to the inductances 12 and 22. Once this has occurred limiting ceases and the load network 18 then controls the voltage across the device 10.

The width of the current pulse in the diode 32 depends substantially on the short circuited response of the second inductance 22, the second capacitance 24 and the load resistance 28. As the diode 32 takes very little direct current, the biasing arrangments do not present problems.

In implementing the r.f. power amplifier the step recovery diode 32 may comprise a BAY 96 or a BXY 28. Alternatively the means 30 may comprise a Schottky diode (replacing diode 32) in series with a secondary load network such as a capacitor and an inductor connected in parallel (replacing bias supply 34).

If the level of the limiting voltage is reduced too far then this will lead to the voltage waveform broadening to the extent that the period during which it stays at the limiting value exceeds half the period of the voltage waveform. When this occurs $\frac{1}{2}CV^2$ losses will occur when the device 10 switches on.

In the illustrated example the limiting voltage level is set at 25 volts for a peak swing of 35V. This allows an approximate 30% (2.5/3.5) reduction in the breakdown voltage of the device 10. If the r.f. power amplifier is readjusted to have a larger power supply voltage and the breakdown voltage of the device 10 is set at its original value (that is 35 volts) a power output increase of 60% can be achieved for the same breakdown voltage or conversely by suitable device processing the on-resistance and breakdown voltage can be reduced, which together with a reduced load resistance and modified load network leads to the amplifier having increased power output for the same efficiency at the original supply voltage.

In a non-illustrated embodiment the polarity of the voltage supply rails 14, 16 may be inverted. Consequently the polarity of the diode 32 and the bias voltage supply 34 need to be inverted and also the switching device 10 would have to handle reverse voltages and currents.

In either embodiment it may be possible to modify the load network 18 and the inductance 12 so that the separate bias supply source 34 can be omitted and the diode 32 be connected directly to the power supply rail 14.

The invention is also applicable to r.f. power amplifiers other than class E amplifiers, for example class C amplifiers in which the load network is capable of adjusting the relative phase of the voltages across and currents through the switching device to obtain high output power or a suitable compromise between high output power and high efficiency.

I claim:

1. An r.f. power amplifier comprising a switching device having a pair of main electrodes, and a load network capable of adjusting the relative phase of the voltages across and the currents flowing between said main electrodes, wherein the amplifier comprises semiconductor means for limiting the peak voltage swing across said main electrodes by storing charge in response to charging of capacitance in parallel with said main electrodes attempting to drive the voltage across said main electrodes to above a predetermined value and releasing the stored charge in response to discharging of said capacitance subsequently attempting to reduce said voltage once again.

2. An amplifier as claimed in claim 1, wherein the load network is capable of adjusting said relative phase to obtain high efficiency.

3. An improved r.f. power amplifier of the type having a switching device and a load network capable of adjusting the relative phase of the voltages across and currents through the switching device, wherein the amplifier comprises semiconductor means for limiting the peak voltage swing across the switching device by storing charge during substantially the time period that the voltage is being limited and subsequently releasing the stored charge, and wherein the semiconductor means comprises a step recovery diode.

4. An improved r.f. power amplifier of the type having a switching device and a load network capable of adjusting the relative phase of the voltages across and currents through the switching device, wherein the amplifier comprises semiconductor means for limiting the peak voltage swing across the switching device by storing charge during substantially the time period that the voltage is being limited and subsequently releasing the stored charge, and wherein the semiconductor means comprises a Schottky diode coupled to a bias supply comprising a load network including a capacitor and inductor coupled in parallel.

5. An amplifier as claimed in claim 3 wherein the diode is connected to a supply rail by way of a bias voltage supply.

* * * * *